United States Patent
Peschke et al.

(10) Patent No.: US 10,732,222 B2
(45) Date of Patent: Aug. 4, 2020

(54) REAL-TIME OSCILLOSCOPE WITH A BUILT-IN TIME DOMAIN REFLECTOMETRY (TDR) AND/OR TIME-DOMAIN TRANSMISSION (TDT) FUNCTION

(71) Applicant: Rohde & Schwarz GmbH & Co. KG, Munich (DE)

(72) Inventors: Martin Peschke, Vaterstetten (DE); Benedikt Lippert, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 131 days.

(21) Appl. No.: 15/940,383

(22) Filed: Mar. 29, 2018

(65) Prior Publication Data
US 2019/0302183 A1 Oct. 3, 2019

(51) Int. Cl.
*G01R 31/317* (2006.01)
*G01R 1/20* (2006.01)

(52) U.S. Cl.
CPC ......... *G01R 31/31725* (2013.01); *G01R 1/20* (2013.01); *G01R 31/31712* (2013.01); *G01R 31/31705* (2013.01)

(58) Field of Classification Search
CPC ............... G01R 31/31712; G01R 1/20; G01R 31/31705
See application file for complete search history.

(56) References Cited

U.S. PATENT DOCUMENTS

| 5,122,694 A * | 6/1992 | Bradford ............... G01R 13/32 326/94 |
| 7,120,840 B1* | 10/2006 | Shimanouchi ..... G01R 31/3191 714/700 |
| 8,706,433 B2 | 4/2014 | Pupalaikis et al. |
| 2011/0191046 A1* | 8/2011 | Pupalaikis ............. G01R 27/28 702/66 |
| 2011/0267036 A1* | 11/2011 | Kharrati ............ G01R 13/0254 324/121 R |

(Continued)

FOREIGN PATENT DOCUMENTS

EP  0244053 A2  11/1987

OTHER PUBLICATIONS

Dr. Hellwig et al., "Advanced Signal Analysis using the History Mode of the R&S® RTO Oscilloscope Application Note", Published by Rohde & Schwarz, May 2013, pp. 1-32.

(Continued)

*Primary Examiner* — Alvaro E Fortich
(74) *Attorney, Agent, or Firm* — Ditthavong & Steiner, P.C.

(57) ABSTRACT

The invention relates to a real-time oscilloscope with a built-in time domain reflectometry (TDR) and/or time-domain transmission (TDT) function for measurements of a device under test (DUT). The real-time oscilloscope comprises at least one built-in generator and at least one real-time measurement channel. The built-in generator is in communication with the real-time measurement channel and the device under test (DUT) and is configured to generate incident signals. The real-time measurement channel is configured to capture incident signals transmitted to and reflected by and/or transmitted by the device under test (DUT).

16 Claims, 9 Drawing Sheets

(56) References Cited

U.S. PATENT DOCUMENTS

| | | | |
|---|---|---|---|
| 2013/0076372 A1* | 3/2013 | Dascher | G01R 35/00 324/601 |
| 2013/0080106 A1* | 3/2013 | Carlson | G01R 31/2841 702/104 |
| 2013/0230111 A1* | 9/2013 | Gur | H04W 76/28 375/244 |
| 2013/0301839 A1* | 11/2013 | Vogel | G10H 5/005 381/61 |
| 2016/0018450 A1 | 1/2016 | Tan et al. | |

OTHER PUBLICATIONS

Dr. Fulton, "Oscilloscope Fundamentals Primer", Published by Rohde & Schwarz USA, Inc., retrieved on Mar. 29, 2018, from http://www.rohde-schwarz-usa.com/rs/rohdeschwarz/images/Oscilloscope-Fundamentals_v1.1.pdf, pp. 1-26.

* cited by examiner

REAL-TIME OSCILLOSCOPE WITH A BUILT-IN TIME DOMAIN REFLECTOMETRY (TDR) AND/OR TIME-DOMAIN TRANSMISSION (TDT) FUNCTION

TECHNICAL FIELD

The invention relates to a real-time oscilloscope with a built-in time domain reflectometry (TDR) and/or time-domain transmission (TDT) function for measurements of a device under test (DUT). The real-time oscilloscope comprises at least one built-in generator and at least one real-time measurement channel.

BACKGROUND ART

Digital oscilloscopes can be grouped into sampling oscilloscopes (also called equivalent-time oscilloscopes) and real-time oscilloscopes. Digital oscilloscopes are indispensable for testing and debugging of electronic and system designs, due to their versatility and flexibility.

The requirements for state-of-the art oscilloscopes are a higher sample rate for a better resolution of signal details and a deeper memory for capturing longer signal sequences. It gets more and more important, being able to acquire rare, random or intermittent events, which typically appear only for a short duration and infrequently.

Sampling oscilloscopes are very useful when analyzing high frequency signals such as repetitive signals whose frequencies are higher than the oscilloscopes sampling rate. Said oscilloscopes achieve their performance by collecting samples from several successive waveforms, and by then assembling them together to reconstruct the overall waveform. For each trigger event, only one sample is taken.

A real-time oscilloscope captures an entire waveform on each trigger event, thus, the real-time oscilloscope is able to capture a large number of data points in one continuous record. The real-time oscilloscope allows the user to display single or rare, random or intermittent events, which is advantageous for many measurement tasks.

One important application of digital oscilloscopes is the determination the characteristics of electrical lines, circuit board traces, connectors and so on, based on time-domain reflectometry (TDR) and time-domain transmission (TDT). Said modules are connected to a device under test (DUT) and are able to generate a fast step signal, called a fast step incident and transmit said fast step incident signal to the device under test (DUT). These modules are further capable of recording the voltage at the device under test input (DUT) and output(s) over time. At the input port, said voltage over time record represents the incident step as well as any reflections coming from the DUT. These reflections are a time-domain representation of the input reflection coefficient of the DUT. Additionally it is possible to record the voltage over time at an output port of the device under test (DUT), which is a time-domain representation of the transfer function of the device under test (DUT).

However, no real-time oscilloscopes providing such TDR and TDT modules are known, thus no real-time oscilloscopes providing a time-domain reflectometry functionality and a time-domain transmission functionality are present.

US 2016/0018450 A1 relates to a method and a system for determining scattering parameters of a device under test (DUT) using a real-time oscilloscope. In FIG. 2, the cited document discloses a system for measuring said scattering parameters, the system comprising a real-time oscilloscope connected to a synchronized trigger that is further connected to a signal generator. Moreover, a power divider is in communication with the real-time oscilloscope, the signal generator and the device under test (DUT).

However, the cited document only discloses a setup including a real-time oscilloscope with external signal generator, external power splitter, external synchronized trigger and cables to connect the single units with each other. Such a setup is expensive, difficult to calibrate, especially due to moving connection cables and cables having different lengths. It is disadvantageous that such a setup uses already two of in most cases 4 channels of the real-time oscilloscope, which reduces the possibility to perform other measurements with the real-time oscilloscope.

Accordingly, there is a need to provide a real-time oscilloscope with a built-in time domain reflectometry (TDR) and/or time-domain transmission (TDT) function to overcome said deficiencies.

SUMMARY OF THE INVENTION

According to a first aspect of the invention, a real-time oscilloscope with a built-in time domain reflectometry (TDR) and/or time-domain transmission (TDT) function for measurements of a device under test (DUT) is provided. The real-time oscilloscope comprises at least one built-in generator and at least one real-time measurement channel. The built-in generator is in communication with the real-time measurement channel and the device under test (DUT) and is configured to generate incident signals. The real-time measurement channel is further configured to capture incident signals transmitted to and reflected by and/or transmitted by the device under test (DUT).

Advantageously, the real-time oscilloscope with a built-in TDR/TDT function including the built-in generator allows the user to generate an incident signal with the built-in generator and further to capture the whole response to the incident signal in one shot with sample rates of typically many giga-samples (GSa) per second. Thus, the inventive real-time oscilloscope can record a single event or coefficients that vary over time. Since the generator to generate incident signals is located within the real-time oscilloscope, and since the software of the real-time oscilloscope directly supports the TDR/TDT function no external units are required to perform TDR/TDT measurements.

No external components, except the device under test (DUT) need to be wired to the real-time oscilloscope, which simplifies calibration and reduces cost, since no additional units such as signal generator or power splitter are required. Furthermore, one channel is sufficient to perform the TDR/TDT measurements, thus the other channels remain free and allow the performance of other measurements.

According to a first preferred implementation form of the first aspect, a trigger functionality is provided enabling the real-time measurement channel to trigger on non-synchronized incident signals transmitted to, reflected and/or transmitted by the device under test (DUT).

Advantageously, real-time oscilloscopes are suitable to analyze intermittent signals and to trigger on a specific event such as a rising voltage threshold, a set up and hold violation, a pattern trigger or other defined triggers. Furthermore, real-time oscilloscopes are able to capture and store continuous sample points around the defined triggers and to update the display with the captured data. Thus, the use of a real-time oscilloscope with a built in TDR/TDT function allows the user to record reflected or transmitted signals, in other words reflected or transmitted electro-magnetic waves, even for non-synchronized (with no fixed time delay) incident signals and response signals, wherein the response signals are the reflected and/or transmitted signals.

According to a further preferred implementation form of the first aspect, the real-time measurement channel is configured to selectively store only data representative for incident signals and the reflected signals as response to the incident signals.

Advantageously, if the time delay between the incident signal and the response signals is very long, a triggering functionality can store only the incident signal and the response signal leaving out the time between incident signal and response signal. This saves memory-capacity and allows a higher resolution for the signal portions of interest.

According to a further preferred implementation form of the first aspect, the built-in generator includes a generator source and a power divider having a first port connected to the generator source, having a second port connected to a first port of the built-in generator and having a third port connected to a second port of the built-in generator.

Advantageously, the signal generated by the generator source is guided to a first port of a power divider (also power splitter) to equally split the signal generated by the generator source into two output signals and to output said output signals on a second and a third output port of the power divider. A simple tee circuit of resistors can be used as a power divider. For a 50Ω system each of the three resistors may have a resistance of 16⅔Ω. The use of the power splitter allows to transmit the incident signal from the generator source to the device under test (DUT) and to transmit the reflected or transmitted signals to the real-time measurement channel.

According to a further preferred implementation form of the first aspect, the built-in generator includes a generator source and an output line with pick off, wherein a first port of the output line is connected to the generator source, a second port of the output line is connected to a first port of the built-in generator and the pick-off is connected to a second port of the built-in generator.

Advantageously, a further option is provided to connect the generator source to the real-time measurement channel and to the device under test (DUT). The generator source is connected to an output line, which is further connected to the real-time measurement channel. The output line provides a pick-off that is connected to the device under test (DUT). Using the pick-off connected to the output line provides an additional option for guiding signals from the generator source to the real-time measurement channel and the device under test (DUT) and from the device under test (DUT) to the real-time measurement channel.

According to a further preferred implementation form of the first aspect, the pick-off attached to the output line is a resistor and/or an active amplifier and/or a coupler.

Advantageously, the pick-off is a resistor, wherein the preferred value of the resistor is 420Ω. To be able to attenuate or amplify the incident signal generated by the signal source or the response signal from the device under test (DUT), which can be a reflection signal or a transmission signal, an active amplifier may be provided additionally or alternatively to the resistor.

According to a further preferred implementation form of the first aspect, the built-in generator generates a step signal, and/or an impulse signal, and/or a sine signal.

Advantageously, the built-in generator, more specifically the generator source located within the built-in generator, is able to generate a step function and/or an impulse signal and/or a sine signal. To perform time-domain reflectometry (TDR) a fast step signal or a fast rise time impulse signal is transmitted to a system, exemplarily a device under test (DUT), which might be a cable, a connector, a PCB trace or similar and the signal reflected by the device under test (DUT) is observed. By analyzing the magnitude, duration and shape of the reflected waveform, the nature of impedance variation in the transmission system can be determined. Using said fast step or impulse signal, the behavior of the DUT within a broad frequency band can be measured. In case the behavior of the DUT at a specific frequency is of interest, a sine signal having the desired frequency, can be generated by the built-in generator.

According to a further preferred implementation form of the first aspect, the built-in generator provides a signal for single-ended signaling.

Advantageously, single-ended signals are referenced to a common level, such as ground. So just one path or wire is required to transmit a single-ended signal. Compared to differential signals that are made up of a pair of paths and require two wires, the use of single-ended signals reduces complexity.

According to a further preferred implementation form of the first aspect, the built-in generator provides a signal for differential signaling.

Advantageously, differential signals over single-ended signals have fewer timing errors, better signal-to-noise ratio, less crosstalk and better immunity to electromagnetic noise. It is conceivable to use a generator source with single-ended outputs and to provide a differential amplifier circuit design being able to generate differential signals. Any other design, known by the practitioner to generate a differential signal based on a generator source with single-ended outputs can be used. It is further conceivable to provide a generator source already providing differential outputs.

According to a further preferred implementation form of the first aspect, the real-time measurement channel provides a first input port connected to a first port of the built-in generator and a second input port connected to an external input socket of the real-time oscilloscope.

Advantageously, an external input socket is provided that allows the user to transmit external signals to the real-time measurement channel. It is conceivable that the output of the device under test (DUT) is connected to said external input socket.

According to a further preferred implementation form of the first aspect, the connection between the first input port of the real-time measurement channel and the first port of the built-in generator and/or the connection between the second input port of the real-time measurement channel and the external input socket is switchable by a switching element. It is further conceivable that a switching element is capable of connecting the external input socket to the first port of the real-time measurement channel and/or to connect the first port of the built-in generator to the second port of the real-time measurement channel.

Advantageously, the switching element allows the user or a control function within the real-time oscilloscope to determine if the first input port of the real-time measurement channel is connected to the first port of the built-in generator or to the external input socket or to neither of them. Furthermore, the switching element allows the user or the control function to determine if the second input port of the real-time measurement channel is connected to the first port of the built-in generator or to the external input socket or to neither of them.

According to a further preferred implementation form of the first aspect, the switching element is a relay and/or a semiconductor switch. It is further conceivable that the switching element is realized with a microelectromechanical system (MEMS).

According to a further preferred implementation form of the first aspect, a second real-time measurement channel is provided and connected to an output port of the device under test (DUT) for capturing signals transmitted by the device under test (DUT) in response to the incident signal generated by the built-in generator.

Advantageously, a second real-time measurement channel allows to easily and directly capture incident signals transmitted by a device under test (DUT).

According to a second aspect of the invention, a method for performing time domain measurements with a real-time oscilloscope with a built-in time domain reflectometry (TDR) and/or a time-domain transmission (TDT) function is provided. The method comprises the steps of generating an incident signal with the aid of a built-in generator and transmitting the incident signal to a device under test (DUT). The method further includes the steps of measuring a reflection signal of said incident signal at an input of the device under test (DUT) and measuring a transmission signal of said incident signal at an output of the DUT. In a further step the incident signals transmitted to and reflected and/or transmitted by the device under test (DUT) are acquired with the aid of the real-time measurement channel.

According to a first preferred implementation form of the second aspect, the method further comprises the step of triggering on non-synchronized incident signals transmitted to, reflected and/or transmitted by the device under test (DUT).

According to a further preferred implementation form of the second aspect, the method further comprises the step of applying a post-processing function to at least two acquisitions with the aid of the real-time measurement channel.

According to a further preferred implementation form of the second aspect, the method further comprises the step of averaging and/or displaying the at least two acquired signals with the aid of the real-time measurement channel.

According to a further preferred implementation form of the second aspect, the method further comprises the step of calculating and/or displaying a waterfall diagram of the at least two acquired signals with the aid of the real-time measurement channel. It is further conceivable that the method comprises the step of calculating and/or displaying a histogram determining the number of occurrence of various delays of the acquired signals or a heat-map showing all time variant responses.

BRIEF DESCRIPTION OF THE DRAWING

Exemplary embodiments of the invention are now further explained with respect to the drawings by way of example only, and not for limitation. In the drawings.

DETAILED DESCRIPTION OF THE PREFERRED EMBODIMENTS

Figure 1:
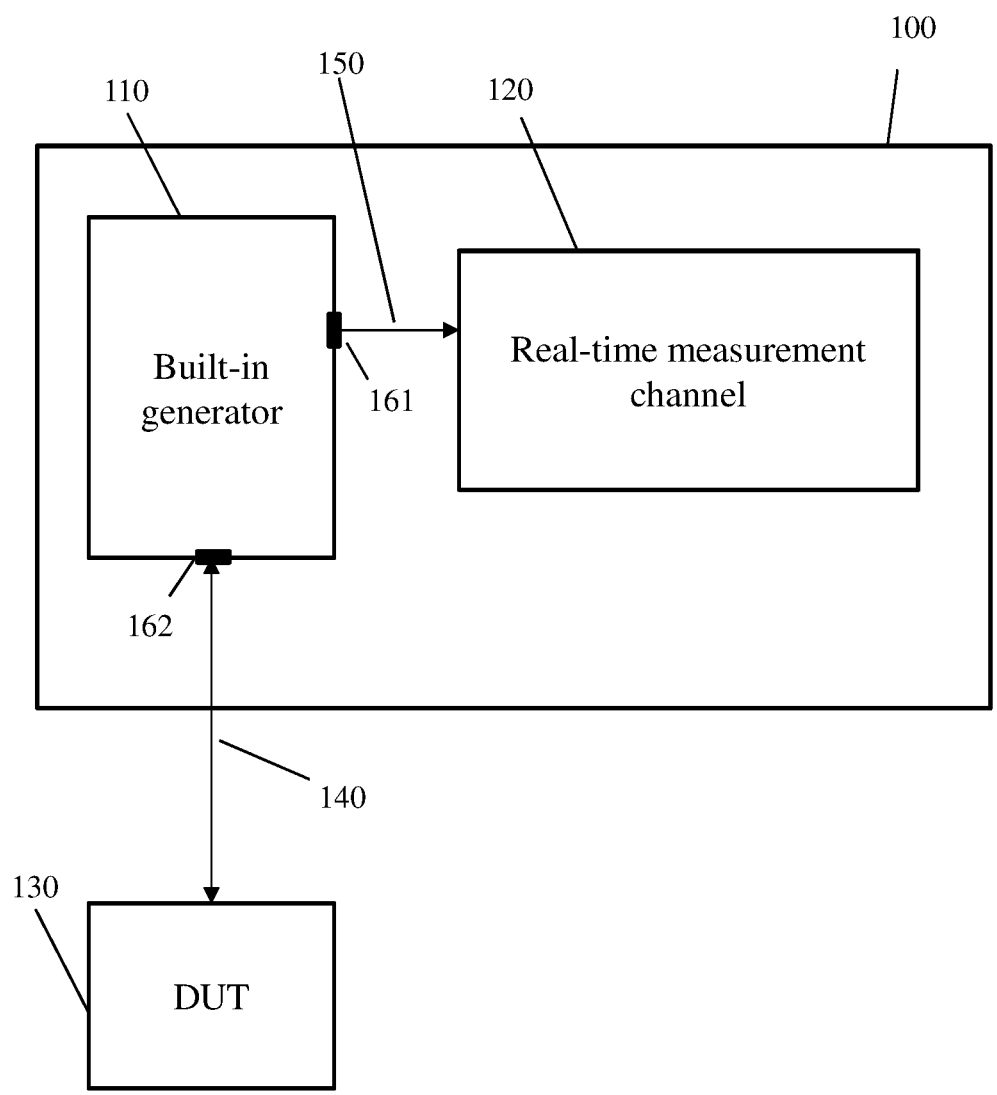
FIG. 1 shows a block diagram of the inventive real-time oscilloscope with a built in generator and a real-time measurement channel.

FIG. 1 illustrates an inventive real-time oscilloscope 100 with a built in generator 110 and a real-time measurement channel 120. The built-in generator 110 is in communication with the real-time measurement channel 120 via a unidirectional connection line 150 that connects a first port 161 of the built-in generator 110 with the real-time measurement channel. The built-in generator is further in communication with a device under test (DUT) 130 via a bi-directional connection line 140 that connects a second port 162 of the built-in generator 110 with the device under test 130 (DUT).

The built-in generator 110 is able to generate so called incident signals. These are signals that are transmitted to a device under test 130 (DUT) and that are reflected and/or transmitted by the device under test 130. Said reflected and/or transmitted incident signals, also called response signals can be analyzed to retrieve information regarding the characteristics of a device under test, such as electrical lines, connectors or cables.

The built-in generator 110 is able to generate different incident signals. Such an incident signal can be a pulse, wherein the width of the pulse determines the resolution of the overall measurement. A narrow pulse offers a good resolution. However narrow pulses include high-frequency signal components that are attenuated along their path. Another possible incident signal is a rise time step. The focus is not on the reflection of a complete pulse, but on a rising edge. Another option for an incident signal is a complex signal, wherein reflections of said complex signal are detected with correlation techniques, such as spread-spectrum time-domain reflectometry.

The connection line 140 from the built-in generator 110 to the device under test 130 can be a connection to an input port of the device under test 130 and/or to an output port of the device under test 130 (input port/output port not shown in FIG. 1). The response signals such as reflection signals at the input port of the device under test 130 and/or transmitted signals from the input port to the output port of the DUT 130 are transmitted via the connection line 140 to the built-in generator 110 and are further transmitted via connection line 150 to the real-time measurement channel 120. In a first measurement, the real-time measurement channel 120 can capture incident signals transmitted to and reflected by the device under test 130 (DUT). In a second measurement the real-time measurement channel 120 can capture incident signals transmitted to and transmitted by the device under test 130 (DUT).

The real-time oscilloscope 100 is capable of capturing an entire waveform on each trigger event, which means that a large number of data points is captured in one continuous record. The real-time oscilloscope 100 can be triggered on a feature of the data itself, and in various applications a trigger event is initiated when the amplitude of an incoming waveform reaches a certain threshold. When the incoming waveform reaches a certain threshold, the real-time oscilloscope 100 starts converting the analog waveform to digital data points at a rate asynchronous and very much unrelated to the input waveform's data rate. The scope samples the amplitude of the input waveform stores that value in a memory, and continuous to the next sample.

Thus, the trigger provides a horizontal time reference point for the incoming data. In other words, the real-time oscilloscope is able to trigger on voltage signals, which makes a recording of reflected or transmitted incident signals possible even for non-synchronized (with no fixed time delay) incident and response signals.

Figure 2:
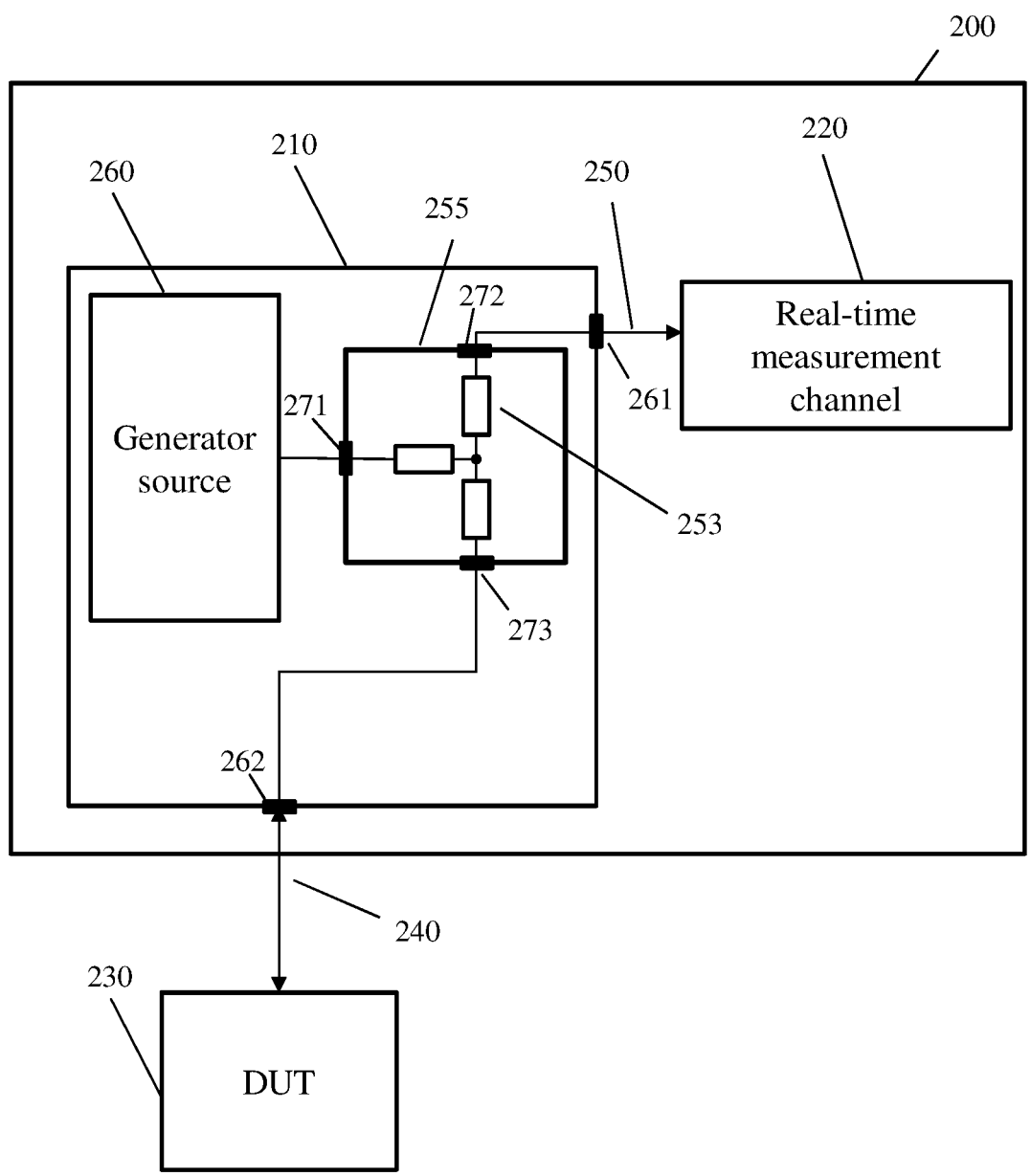
FIG. 2 shows a block diagram of an exemplary embodiment of the built-in generator of the first aspect of the invention with a generator source and a power divider.

FIG. 2 illustrates an exemplary embodiment of the built-in generator 210 in more detail. The built-in generator 210, which is located in the real-time oscilloscope 200, further consists of a generator source 260 and a power divider 255. The generator source 260 is capable of generating desired incident signals and to transmit said incident signals to a first port 271 of the power divider 255 (also called power splitter). A second port 272 of the power divider 255 is connected to a first port 261 of the built-in generator 210 and a third port 273 of the power divider 255 is connected to a second port 262 of the built-in generator 210. The first port 261 of the built-in generator is connected via the connection line 250 to the real time measurement channel 220 and the second port 262 of the built-in generator is connected via the connection line 240 to the device under test 230 (DUT).

A simple tee circuit of resistors 253 can be used as a power divider 255. For a 50Ω system each of the three resistors 253 may have a resistance of 16⅔Ω.

Using the power divider 255, allows to equally split the incident signal generated by the generator source 260 in two output signals and to transmit the incident signal to the device under test 230 and to the real-time measurement channel 220 at the same time. The signal reflected and/or transmitted by the device under test 230 (DUT) is transmitted via the connection line 240 (also called transmission line) and via the power divider 255 and the connection line 250 to the real-time measurement channel 220, which is configured to capture the incident signals transmitted to and reflected and/or transmitted by the device under test (DUT) 230.

Figure 3:
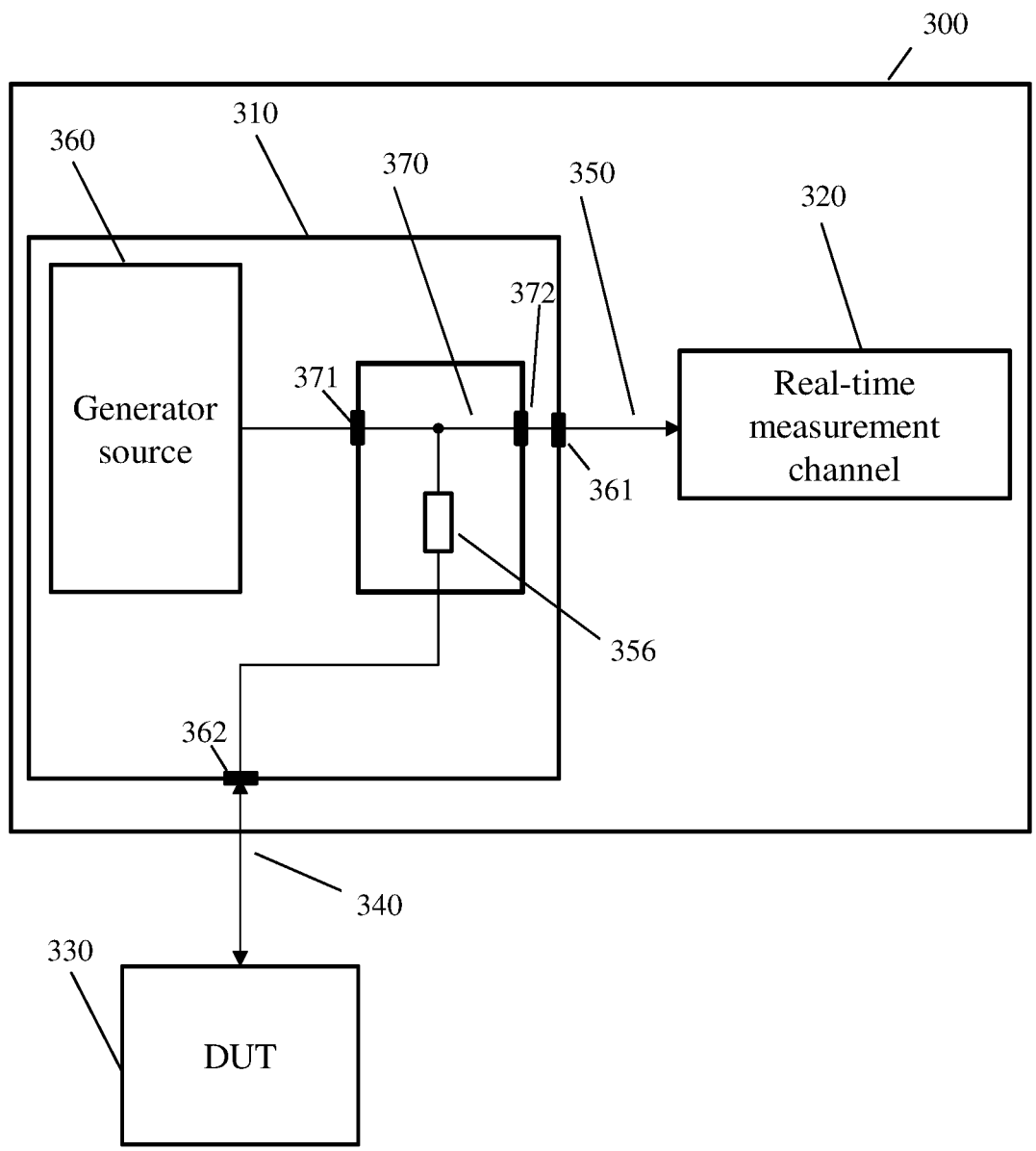
FIG. 3 shows a block diagram of an exemplary embodiment of the built-in generator of the first aspect of the invention with a generator source and an output line with pick-off.

FIG. 3 illustrates an exemplary embodiment of the built-in generator 310, including a generator source 360 and an output line 370 with pick-off 356.

The built-in generator 310, which is located in the real-time oscilloscope 300, further consists of a generator source 360 and an output line 370 with pick-off 356. The generator source 360 is capable of generating desired incident signals and to transmit said incident signals to a first port 371 of the output line 370. A second port 372 of the output line 370 is connected to a first port 361 of the built-in generator 310. Furthermore, the pick-off 356 is connected to a second port 362 of the built-in generator 310. The first port 361 of the built-in generator 310 is connected via the connection line 350 to the real time measurement channel 320 and the second port 362 of the built-in generator 310 is connected via the connection line 340 to the device under test 330 (DUT).

As exemplarily shown in FIG. 3, the pick-off 356 is a resistor, preferably having a resistance value of 420Ω.

To be able to attenuate or amplify the incident signal generated by the generator source 360 or the response signal from the device under test (DUT) 330, which can be a reflection signal or a transmission signal, an active amplifier can be used instead or additionally to the resistor 356.

Figure 4:
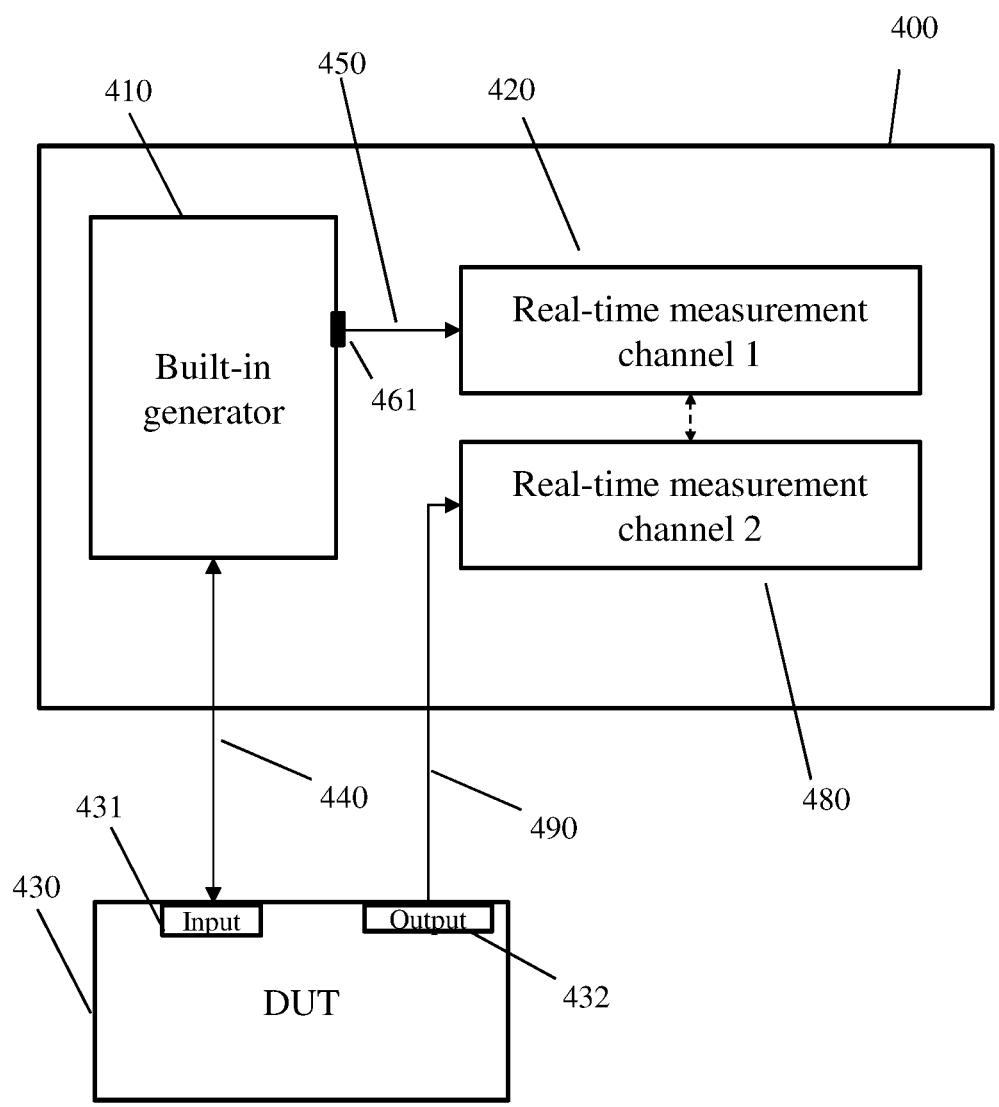
FIG. 4 shows a block diagram of the inventive real-time oscilloscope with a built in generator and two real-time measurement channels.

FIG. 4 illustrates an inventive real-time oscilloscope 400 with a built in generator 410, a first real-time measurement channel 420 and a second real-time measurement channel 480. The built-in generator 410 is in communication with the first real-time measurement channel 420 via a uni-directional connection line 450 that is connected to a first input port of the first real-time measurement channel 420. The built-in generator 410 is further in communication with a device under test (DUT) 430 via a bi-directional connection line 440. The device under test 430 (DUT) provides an input port 431 and an output port 432. The bi-directional connection line 440 is connected to the input port 431 of the device under test 430. The output port 432 of the device under test 430 is connected to a first input port of the second real-time measurement channel 480 via a connection line 490.

Providing two real-time measurement channels allows to use one channel, according to FIG. 4 the first real-time measurement channel 420 for measuring an incident signal transmitted to and reflected by the device under test 430 (DUT) at the input port 431 of the device under test. The second real-time measurement channel 480 serves for measuring a transmission signal of said incident signal at the output 432 of the device under test 430 (DUT). Both real-time measurement channels 420, 480 are in communication with each other to be able to provide the second real-time measurement channel 480 with information regarding the incident signal.

As shown in FIG. 2 to FIG. 4 the built-in generator 210, 310, 410 as well as the first port 261, 361, 461 of the built-in generator as well as the real-time measurement channel 220, 320, 420, and as well as the connection lines 250, 350, 450, are located within the real-time oscilloscope 200, 300, 400 housing. In other words aforementioned units are all disposed inside the housing of the real-time oscilloscope.

FIG. 1 to FIG. 4 show a built-in generator, respectively the generator source providing a single-ended signal. Thus, just one power divider and one pick-off are shown in FIG. 2 respectively in FIG. 3. However, it is conceivable to use differential signals as incident signals, since differential signals have many advantageous over single-ended signals, such as fewer timing errors or better signal-to-noise ratio.

When differential incident signals are provided the built-in generator includes two power dividers and/or two pick-offs to be able to handle differential signals. In addition the ports have to be suitable for the use of differential signals wherever appropriate.

Figure 5:
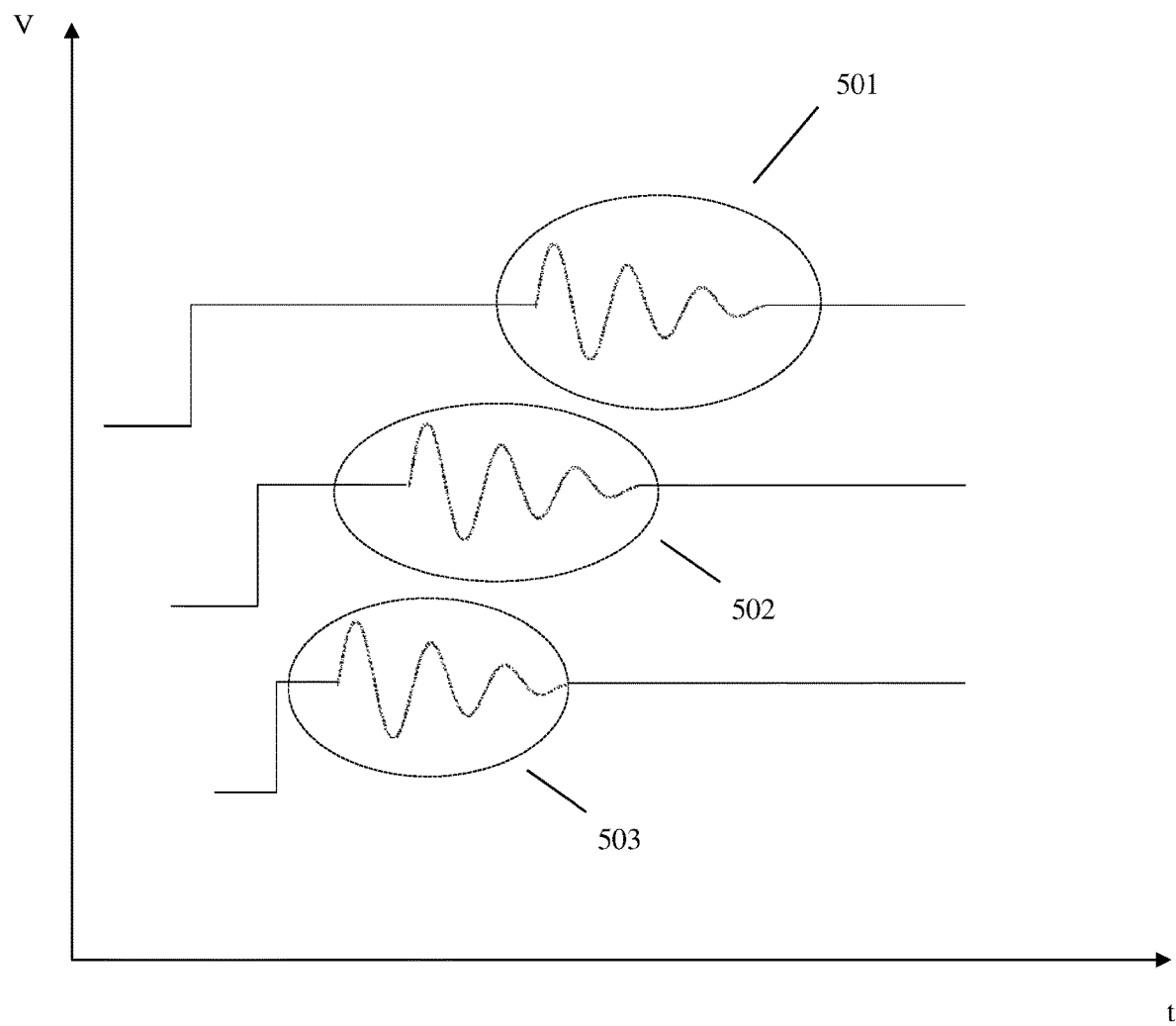
FIG. 5 shows a reflections caused by a step signal, the reflections wandering towards the step signal.

FIG. 5 shows several curves 501, 502, 503 of measurements of a reflection signal respectively a reflected electromagnetic wave over time caused by a step signal as incident signal. FIG. 5 shows that the reflected signals are not constant over time. According to FIG. 5 the reflection wave propagates towards the step signal. Such time variant responses can be exemplarily caused by active parts within the device under test (DUT). Since network analyzers and sampling oscilloscopes cannot measure time variant signals a real-time oscilloscope has to be used for said measurements.

Figure 6:
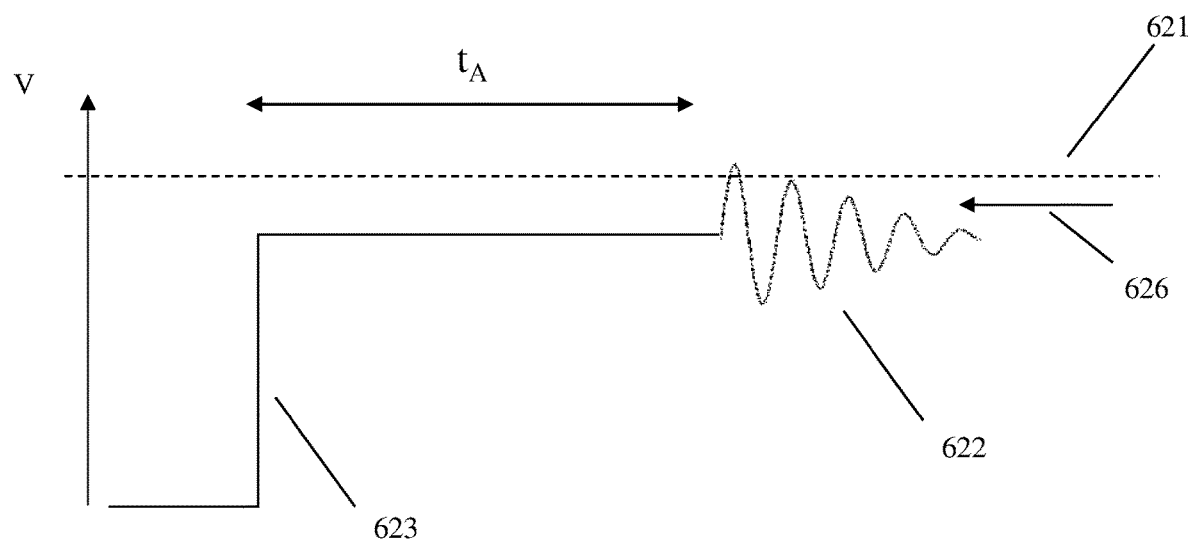
FIG. 6 shows a time delay $t_A$ between an incident signal and the response signal initiated by the incident signal.

FIG. 6 shows a time delay $t_4$ between an incident signal and the response signal initiated by the incident signal. According to FIG. 6, the time delay $t_4$ between the incident signal and the receiving a response signal can be very long. To save memory-capacity and to be able to provide a higher resolution for the signal portions of interest, only the incident and the responding signal are captured by the real-time measuring channel, while no signals are captured for the time between the incident signal and the response signal. This can be achieved by exemplarily triggering on a pre-defined voltage value as indicated with line 621, representing the pre-defined voltage threshold value. When said voltage threshold is exceeded the real-time channel starts capturing the signals. The arrow pointing towards the incident signal, indicated with referral number 626 indicates that the response signal is propagating towards the incident signal.

Figure 7:
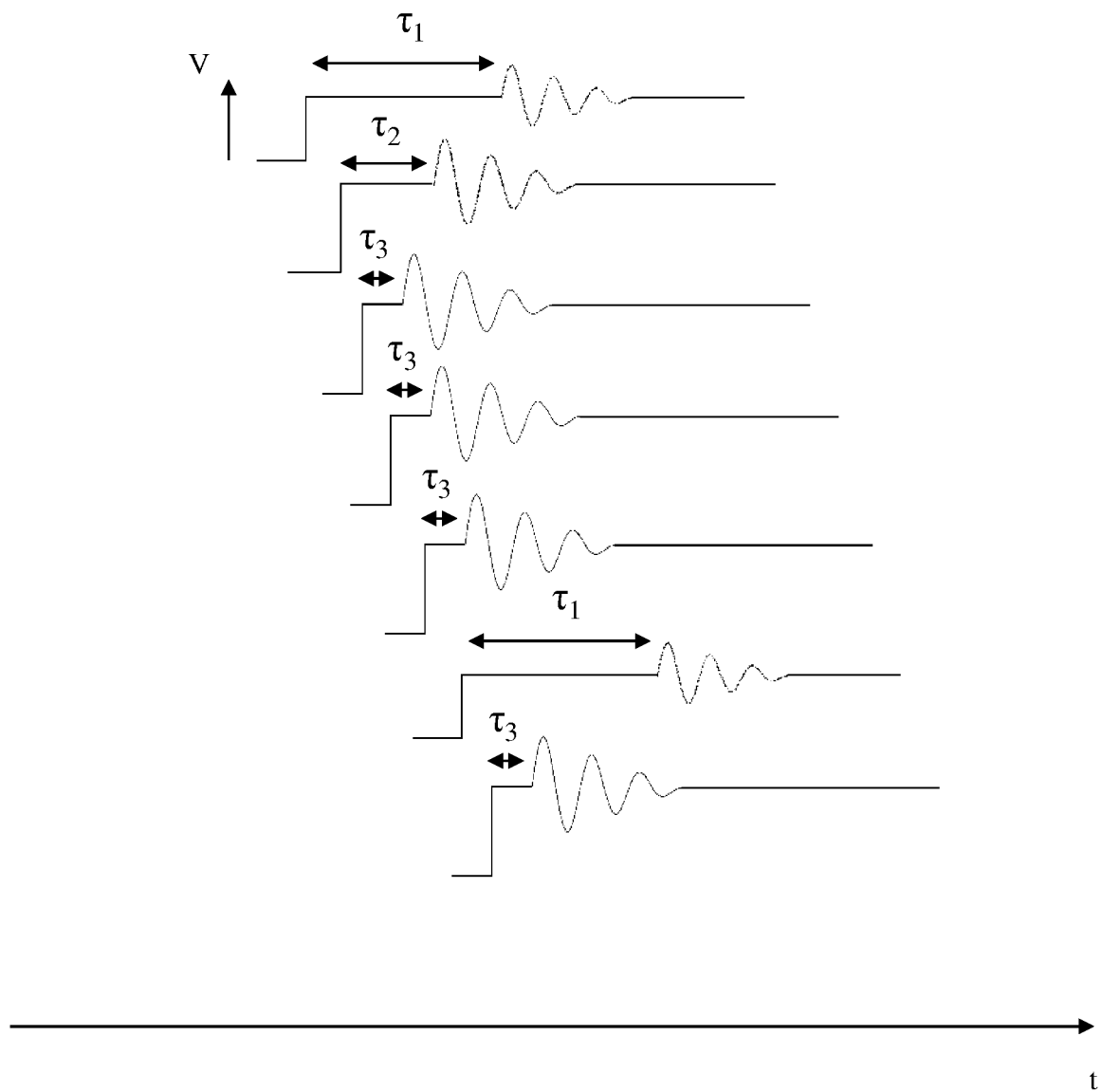
FIG. 7 shows several curves having different time delays $\tau_1$, $\tau_2$ and $\tau_3$ between an incident signal and the response signal initiated by the incident signal.

FIG. 7 shows several curves having different time delays $\tau_1$, $\tau_2$ and $\tau_3$ between an incident signal and the response signal initiated by the incident signal. This figure is provided to exemplarily present possible response signals of several time-domain reflectometry measurements. The presented curves are further used in FIG. 8 to generate a histogram.

Figure 8:
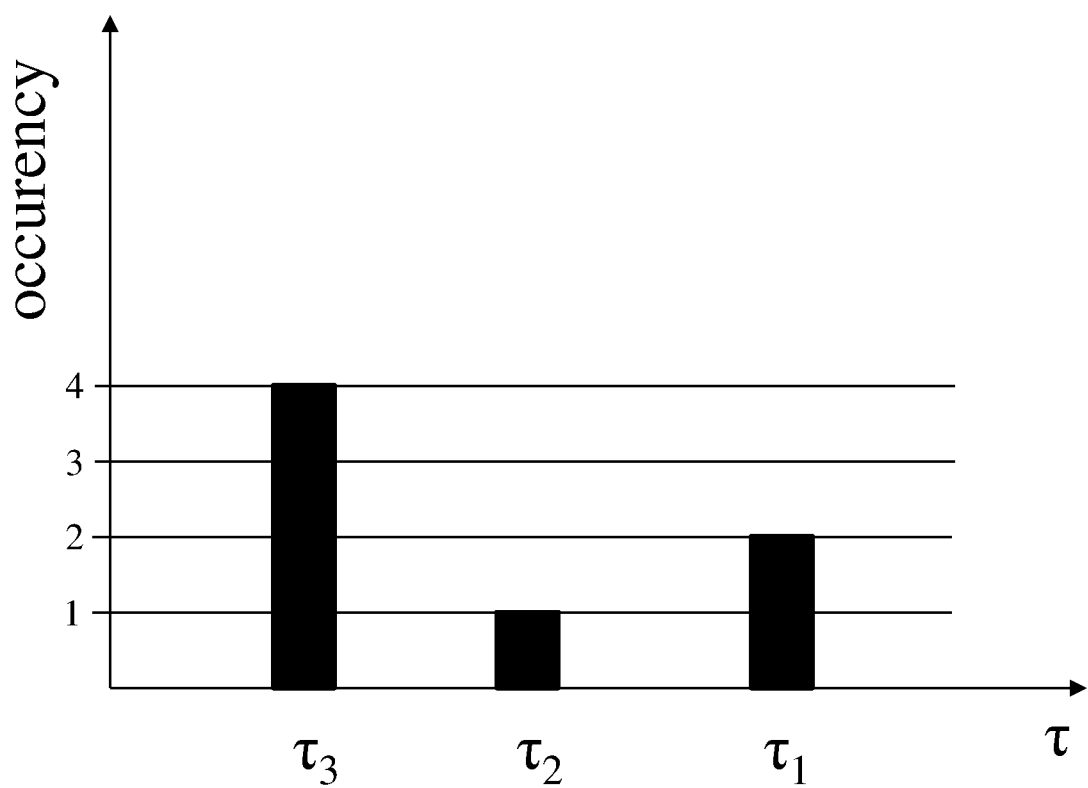
FIG. 8 shows a histogram related to the curves in FIG. 7.

FIG. 8 shows a histogram based on the delay times of the curves presented in FIG. 7. The histogram is a representation of an exemplary result of a post-processing function based on response signals acquired by the real-time measurement channel. According to FIG. 7 there are four curves having a time delay of $\tau_3$, there is one curve having a time delay of $\tau_2$, and finally there are two curves having a time delay of $\tau_1$. These curves are represented in the histogram in FIG. 8, which clearly shows an occurrence of 4 for $\tau_3$, an occurrence of 1 for $\tau_2$ and finally an occurrence of 2 for $\tau_1$.

A variety of other post-processing functions such as averaging of acquired signals, calculating waterfall diagrams, heat-maps or other post-processing functions are conceivable.

Figure 9:
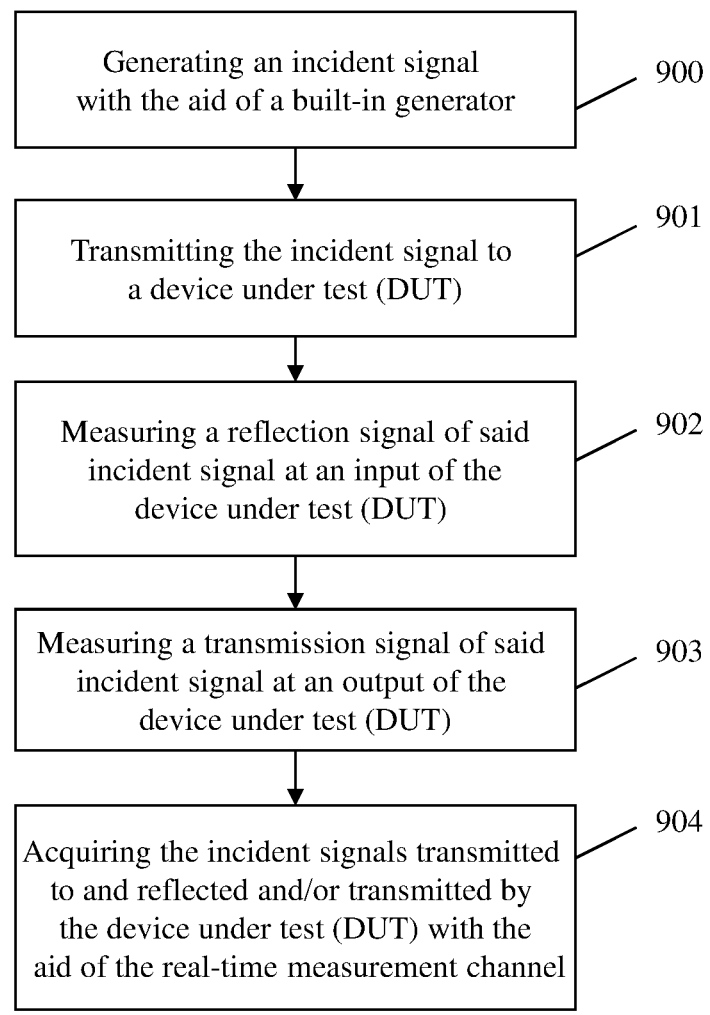
FIG. 9 shows a flow chart of an exemplary embodiment of a measurement method of the second aspect of the invention.

Finally, FIG. 9 shows a flow chart of the inventive measurement method. In a first step S900 an incident signal with the aid of a built-in generator 110 is generated. The incident signal can exemplarily be a calibrated step edge having a voltage in the mV range.

In a following step S901 the incident signal is transmitted to a device under test 130 (DUT). The signal generated by the built-in generator 110 is called an incident signal, since the signal causes a response from the device under test (DUT) 130. The incident signal is usually, partially reflected by the DUT 130, which can be measured as reflection signal, and the incident signal partially goes through the DUT 130 and can be measured at an output of the DUT 130 as transmission signal.

In a further step S902 a reflection signal of said incident signal is measured at an input of the device under test 130 (DUT). When the incident signal is sent into the DUT 130 any changes in the instantaneous impedance the step edge encounters along its path will cause some of the signal to reflect back depending on the change of impedance present.

In a further step S903 a transmission signal of said incident signal is measured at an output of the device under test 130 (DUT).

In a last step S904 the incident signals transmitted to and reflected and/or transmitted by the device under test 130 (DUT) are acquired with the aid of the real-time measurement channel 120.

While various embodiments of the present invention have been described above, it should be understood that they have been presented by way of example only, and not for limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents. For example currents can be measured instead of voltages.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A real-time oscilloscope with a built-in time domain reflectometry (TDR) and/or time-domain transmission (TDT) function for measurements of a device under test (DUT), comprising:
   at least one built-in generator, and
   at least one real-time measurement channel,
   wherein the built-in generator is in communication with the real-time measurement channel and the device under test (DUT) and is configured to generate incident signals,
   wherein the real-time measurement channel is configured to capture incident signals transmitted to and reflected by and/or transmitted by the device under test (DUT), and
   wherein a trigger functionality is provided enabling the real-time measurement channel to trigger on nonsynchronized incident signals transmitted to, reflected and/or transmitted by the device under test (DUT).

2. The real-time oscilloscope according to claim 1, wherein the real-time measurement channel is configured to selectively store only data representative for incident signals and the reflected signals as response to the incident signals.

3. The real-time oscilloscope according to claim 1, wherein the built-in generator includes a generator source and a power divider having a first port connected to the generator source, having a second port connected to a first port of the built-in generator and having a third port connected to a second port of the built-in generator.

4. A real-time oscilloscope with a built-in time domain reflectometry (TDR) and/or time-domain transmission (TDT) function for measurements of a device under test (DUT), comprising:
   at least one built-in generator, and
   at least one real-time measurement channel,
   wherein the built-in generator is in communication with the real-time measurement channel and the device under test (DUT) and is configured to generate incident signals,
   wherein the real-time measurement channel is configured to capture incident signals transmitted to and reflected by and/or transmitted by the device under test (DUT),
   wherein the built-in generator includes a generator source and an output line with pick off, and
   wherein a first port of the output line is connected to the generator source, a second port of the output line is connected to a first port of the built-in generator and the pick-off is connected to a second port of the built-in generator.

5. The real-time oscilloscope according to claim 4, wherein the pick-off attached to the output line is a resistor and/or an active amplifier and/or a coupler.

6. The real-time oscilloscope according to claim 1, wherein the built-in generator generates a step signal, and/or an impulse signal, and/or a sine signal.

7. The real-time oscilloscope according to claim 1, wherein the built-in generator provides a signal for single-ended signaling.

8. The real-time oscilloscope according to claim 1, wherein the built-in generator provides a signal for differential signaling.

9. The real-time oscilloscope according to claim 1, wherein the real-time measurement channel provides a first input port connected to a first port of the built-in generator and a second input port connected to an external input socket of the real-time oscilloscope.

10. The real-time oscilloscope according to claim 9, wherein the connection between the first input port of the real-time measurement channel and the first port of the built-in generator and/or the connection between the second input port of the real-time measurement channel and the external input socket is switchable by a switching element.

11. The real-time oscilloscope according to claim 10, wherein the switching element is a relay and/or a semiconductor switch.

12. The real-time oscilloscope according to claim 1, wherein a second real-time measurement channel is provided and connected to an output port of the device under test (DUT) for capturing signals transmitted by the device under test (DUT) in response to the incident signal generated by the built-in generator.

13. A method for performing time domain measurements with a real-time oscilloscope the method comprising the steps of:

generating an incident signal with the aid of a built-in generator, transmitting the incident signal to a device under test (DUT), measuring a reflection signal of said incident signal at an input of the device under test (DUT) and measuring a transmission signal of said incident signal at an output of the DUT, acquiring incident signals transmitted to and reflected and/or transmitted by the device under test (DUT) with the aid of a real-time measurement channel, and triggering on non-synchronized incident signals transmitted to, reflected and/or transmitted by the device under test (DUT).

14. The method according to claim 13, wherein the method further comprises the step of applying a post-processing function to at least two acquisitions with the aid of the real-time measurement channel.

15. The method according to claim 14, wherein the method further comprises the step of averaging the at least two acquisitions with the aid of the real-time measurement channel.

16. The method according to claim 14, wherein the method further comprises the step of calculating and displaying a waterfall diagram of the at least two acquisitions with the aid of the realtime measurement channel.

\* \* \* \* \*